United States Patent [19]

Betts et al.

[11] Patent Number: 5,768,311
[45] Date of Patent: Jun. 16, 1998

[54] INTERPOLATION SYSTEM FOR FIXED SAMPLE RATE SIGNAL PROCESSING

[75] Inventors: William Lewis Betts, St. Petersburg; Keith Alan Souders, Tampa, both of Fla.

[73] Assignee: Paradyne Corporation, Largo, Fla.

[21] Appl. No.: 577,786

[22] Filed: Dec. 22, 1995

[51] Int. Cl.$^6$ .................................................. H04B 1/38
[52] U.S. Cl. ........................ 375/222; 375/232; 375/236; 375/355; 364/724.1
[58] Field of Search ................................ 375/222, 279, 375/230, 232, 236, 355, 350; 364/724.1, 724.01, 724.2

[56] References Cited

U.S. PATENT DOCUMENTS

| | | | |
|---|---|---|---|
| 3,851,252 | 11/1974 | Karnaugh et al. | |
| 4,521,866 | 6/1985 | Petit et al. | 364/724 |
| 5,051,981 | 9/1991 | Kline | 370/32.1 |
| 5,513,209 | 4/1996 | Holm | 375/354 |
| 5,550,764 | 8/1996 | Mandl | 364/724.1 |
| 5,559,513 | 9/1996 | Rothermel et al. | 364/724.1 |
| 5,621,404 | 4/1997 | Heiss et al. | 364/724.1 |
| 5,648,777 | 7/1997 | Bays et al. | 364/724.1 |

*Primary Examiner*—Don N. Vo
*Attorney, Agent, or Firm*—Thomas, Kayden, Horstemeyer & Risley

[57] ABSTRACT

Using digital signal processing in a modem attached to a digital line, the modem sample rate for both transmit and receive signals is interpolated or decimated to the time slot rate of a digital channel connected to the modem by filters which are operated by a unified interpolation/decimation filter controller as a function of a modulo counter. For example, a modem signal is developed as if it were to be supplied to a codec. However, instead of being supplied to the codec, the signal is filtered using a low pass finite impulse response digital filter. The resulting filtered signal is sampled at the time slot rate and supplied in companded form as an output to the time slots of the digital line. Prior to operating the filter, the ratio of the time slot rate to the sample rate is determined. The ratio is expressed in a form that is a ratio of the smallest possible integers. The numerator of the resulting ratio is designated P and the denominator is designated I. The coordination between the development of the modem signal sample and the filter operation is under the control of a modulo counter that has a modulus of P.

31 Claims, 2 Drawing Sheets

# INTERPOLATION SYSTEM FOR FIXED SAMPLE RATE SIGNAL PROCESSING

TECHNICAL FIELD

This invention relates generally to modems that interface to a digital line having a fixed time slot rate for each channel, e.g., T1, E1, or integrated services digital network (ISDN), and, in particular, to such modems that must also be able to communicate with already existing analog modems operating under various modem standards, e.g., International Telecommunications Union's (ITU, formerly CCITT) V.32 and V.34.

BACKGROUND OF THE INVENTION

In order to get better performance and to save cost, it is desirable that a modem that has access to a digital line place digital data representing the signal to be transmitted directly into the time slots of the digital line. If this is done properly, then, when the signal is transported across a digital network, e.g., the AT&T digital transport network, the signal from the digital line may be converted to analog downstream, e.g., in the last central office prior to being transported over an analog line to the receiving modem. However, in order to do so, the sample rate of the modem must be interpolated to the time slot rate. For example, for the International Telecommunications Union's (ITU, formerly CCITT) standard V.34, the symbol rates are typically, 2400, 2743, 2800, 3000, 3200, 3429 and the sample rate is typically three or four times the symbol rate. The time slot rate of the digital line is typically 8 kHz, which is often used in conventional telephone networks for the transport of voice and data.

One prior art solution for developing a digital output from a modem at 8 kHz is to connect back-to-back a) the codec conventionally found in the modem for developing the analog modem signal and b) an additional codec for converting the analog modem signal back to digital form at the 8 kHz rate. However, obviously, such a solution increases the cost of the modem rather than decreasing its cost as well as possibly introducing additional quantization error which reduces the modem's performance.

Typically, in a full duplex system, if the transmitter is interpolating then the receiver is decimating. Likewise, if the receiver is interpolating then the transmitter is decimating. The particular role assignment depends on the whether the time slot rate is greater than the sample rate or vice-versa. In variable sample rate systems this typically requires both an interpolator and a decimator to be available in both the transmitter and receiver with complex switching logic for switching between the filter types.

SUMMARY OF THE INVENTION

In accordance with the principles of the invention, using digital signal processing in a modem attached to a digital line, a modem sample rate is interpolated or decimated, as appropriate based on the particular rates being used, to the time slot rate of the digital channel by a filter which is operated by a unified interpolation/decimation filter controller as a function of the value of a modulo counter. Advantageously, the invention provides a simple and flexible arrangement for converting a first sample rate to any number of other sample rates.

For example, for the modem transmitter, a modem transmit signal is developed in the conventional manner as if it were to be supplied to a codec. However, instead of being supplied to the codec, the modem transmit signal is filtered using a low pass finite impulse response digital filter. The resulting filtered modem transmit signal is sampled at the time slot rate and then applied to a companding algorithm, e.g., μ-law or A-law, as appropriate. Each sample of the companded signal is supplied as an output to a time slot of the digital line. The filtering and sampling process are controlled in response to a modulo counter.

In accordance with an aspect of the invention, prior to operating a filter for interpolation or decimation, the ratio of the time slot rate to the sample rate is determined. The ratio is expressed in a form that is a ratio of the smallest possible integers. The numerator of the resulting ratio is designated P and the denominator is designated I. The filter is arranged so that its effective sampling rate, i.e., the rate that samples are taken at the taps of the filter and the output of the filter determined, is set to the product of P and the sample rate, which is the same value as the product of I and the time slot rate. It is also at this effective sampling rate that new data samples are theoretically moved into the filter. However, in accordance with an aspect of the invention, to avoid unnecessary computations, the outputs of the transmit filter are only computed at the time slot rate. The coordination between the development of the modem signal sample and the filter operation is under the control of a modulo counter that has a modulus of P, in accordance with an aspect of the invention. Note that when the invention is implemented for a modem receiver, the outputs of the receive filter are only computed at the receive sample rate.

In a typical application of the invention, the modem sample rates for both the transmit and receive signals are interpolated or decimated, as appropriate based on the particular rates being used, to the time slot rate of the digital channel, the interpolation or decimation of each of the transmit and receive signals being performed by respective filters which are operated by the unified interpolation/decimation filter controller as a function of the value of a single modulo counter. Advantageously, complex switching logic for switching between the filter types is not required. Such a system is particularly valuable in V.34 modems which use 6 different sample rates, one of which is below the common 8 kHz digital time slot rate and five of which are above the 8 kHz digital time slot rate.

Another advantage of the invention is that it allows simple implementation of independent transmit and receive symbol rates using a single signal processor.

DETAILED DESCRIPTION

To convert an analog signal represented by digital samples at a first sample rate to digital samples at a second sample rate, what effectively must be done is to develop the analog signal corresponding to the samples at the first sample rate, e.g., using a digital to analog converter, and then sample the developed analog signal, e.g., using an analog to digital converter, at a second sampling rate. In the digital domain, to do so with good results, what must be done is to digitally low pass filter the signal at the first sample rate so as to smooth it and then to take values of the filtered signal at the second sample rate. Of course, to insure that the fidelity of the analog signal is maintained, both sampling rates must be greater than the Nyquist rate for the analog signal. In accordance with the an aspect of the invention, the filtering is performed by a low pass finite impulse response digital filter.

Figure 1:
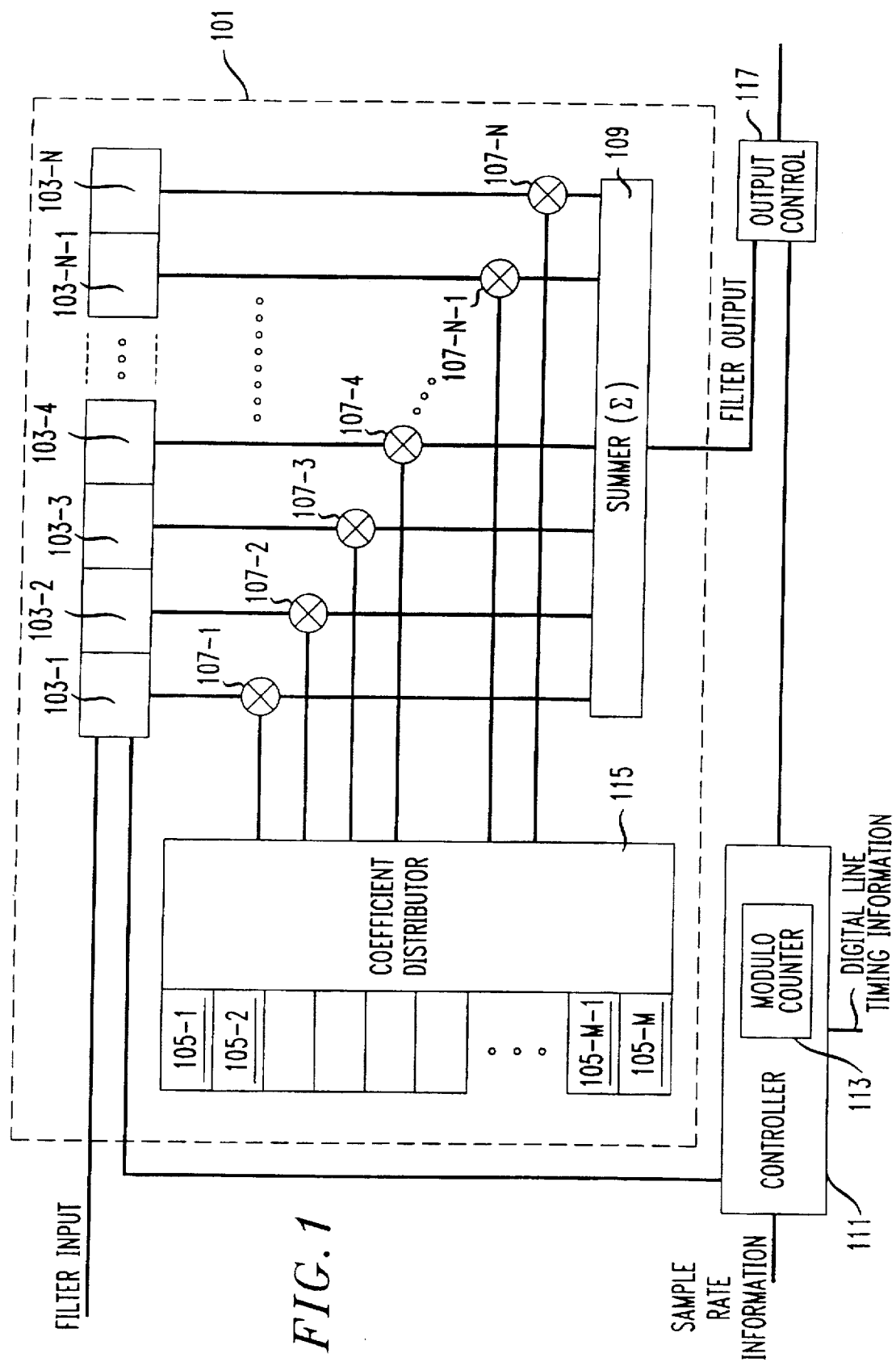
FIG. 1 shows, in block diagram form, an exemplary system for performing interpolation or decimation in accordance with the principles of the invention.

FIG. 1 shows, in block diagram form, an exemplary system for performing interpolation or decimation in accordance with the principles of the invention. The system of FIG. 1 includes exemplary digital low pass finite impulse response filter 101. Digital low pass finite impulse response filter 101 includes: a) sample storage locations 103-1 through 103-N arranged to form a filter delay line; b) filter coefficients 105, including filter coefficients 105-1 to 105-M; c) digital multipliers 107, including digital multipliers 107-1 to 107-N; and d) summer 109; conventionally arranged.

In accordance with aspects of the invention, the system of FIG. 1 also includes 1) controller 111, 2) optional coefficient distributor 115, and 3) output control 117. Controller 111 controls performance of the interpolation or decimation process in response to modulo counter 113, which may be included therein as shown. Controller 111 may also receive and be responsive to, digital line timing information and sample rate information. In particular, controller 111 may determine: a) when new information is entered into the delay line of digital low pass finite impulse response filter 101 and the rate at which information is advanced therein; b) the particular one of coefficients 105 that is supplied to each particular one of multipliers 107; and c) when the output of digital low pass finite impulse response filter 101 becomes available. To the latter ones of these ends controller 111 is coupled to: 1) optional coefficient distributor 115, which provides particular ones of filter coefficients 105 to particular ones of digital multipliers 107 as specified by controller 111; and 2) output control 117, which determines the availability of the output of digital low pass finite impulse response filter 101 as specified by controller 111.

Digital low pass finite impulse response filter 101 is designed using well known filter design techniques to achieve a desired degree of rejection of alias frequency components based on the signal bandwidths, e.g., based on the highest frequency present in the transmitted or received signal. An initial design for digital low pass finite impulse response filter 101 is often developed by setting M and N to the same value, so that there is a unique, respective one of coefficients 105 associated with each of sample storage locations 103. As an example, for a V.34 modem running symbol rate of 3200 that is coupled to a digital line at an 8 kHz time slot rate, a good value for each of M and N is 115. Likewise, filters having identical values for M and N in the range between 200 and 315 have proven useful for other V.34 symbol rates. Typically, after an initial design of digital low pass finite impulse response filter 101 which has the desired filtering properties is developed, the filter design may be improved, for example as described hereinbelow in accordance with aspects of the invention, to reduce storage requirements, improve operating efficiency, enhance performance or the like. Such improvements may result in M not being equal to N in the ultimate implementation of digital low pass finite impulse response filter 101.

Digital low pass finite impulse response filter 101, as well as the entire system of FIG. 1, may be implemented a) using dedicated hardware of any type; b) in software running on a general purpose processor; c) in software running on a digital signal processor; d) any combination of the foregoing; or e) the like.

A modem employing the invention would typically have two filters such as digital low pass finite impulse response filter 101, a so-called "transmit" filter for the transmitter section of the modem and a so-called "receive filter" for the receive section of the modem. For ease of exposition, it is assumed that digital low pass finite impulse response filter 101 is employed for the transmit portion of a modem. However, those of ordinary skill in the art will appreciate how to employ digital low pass finite impulse response filter 101 in the receive portion of a modem. Advantageously, the transmitter and receiver of the modem may be operating using different sample rates.

Each sample rate that can be supported in a particular modem may require a different filter, e.g., a different length and a different set of coefficients. Also, different filters may be required for the transmit and receive filters. Different shorter filters may be desired where, for example, a low throughput delay is required. However, in some applications, a single filter may be used for both the transmit and the receive filters.

Prior to operating the filter, the ratio of the time slot rate to the sample rate is determined. The ratio is expressed in a form that is a ratio of the smallest possible integers. The numerator of the resulting ratio is designated P and the denominator is designated I. The filter is arranged so that its effective sampling rate, i.e., the rate that samples are theoretically taken at the taps of the filter, is set to the product of P and the sample rate, which is the same value as the product of I and the time slot rate. Also, it is at this effective sampling rate that, theoretically, samples are moved into the filter delay line.

TABLE 1

| Symbol Rate | Sample Rate | P | I | $f_e$ |
| --- | --- | --- | --- | --- |
| 2400 | 7200 | 10 | 9 | 72K |
| 2743 | 8229 | 35 | 36 | 288K |
| 2800 | 8400 | 20 | 21 | 168K |
| 3000 | 9000 | 8 | 9 | 72K |
| 3200 | 9600 | 5 | 6 | 48K |
| 3429 | 10286 | 7 | 9 | 72K |

Table 1 shows exemplary values of I and P for the 6 different sample rates available in a V.34 modem when such a modem is coupled to a digital line at an 8 kHz time slot rate, as well as the resulting effective sample rate, $f_e$. In Table 1, the symbol and sample rates are rounded to the nearest whole integer but an actual modem would use the symbol rates as defined by the ITU. For example, the symbol rate 2743 shown in Table 1 corresponds to the ITU symbol rate of ((8*2400) / 7).

New samples are generated in the transmit section of a modem at the sample rate, e.g., typically three times the symbol rate, which is the above noted first sample rate. As noted above, in theory, the samples are moved into the filter delay line of the transmit filter at the effective sampling rate. However, at the effective sample rate, P-1 zero values are inserted into the transmit filter between each real sample value, which are developed only at the first sampling rate. This is because, no new data values that can be placed in the filter are generated between each real sample value generated by the modem, and so the data values between each real sample value are zero. Advantageously, the data of the transmit filter may be stored in a compact form which leaves out the zero data values. Correspondingly, the transmit filter coefficients may be specified so that only every Pth coefficient is used during any calculation of the transmit filter output because it is only these coefficients that will correspond to non-zero data values.

To avoid unnecessary computations, which are those known to result only in output values of zero or discarded information, the outputs of the transmit filter are only computed at the time slot rate, e.g., 8 kHz, in accordance with an aspect of the invention. Thus, the values that would be developed at the output of the transmit filter if the output of the filter was actually determined at the effective sampling rate and which do not correspond to the availability of a new time slot on the digital line—which occurs at the time slot rate—in practice need not be computed. This is because such outputs correspond to nontransmitting times, and are therefore discarded. Thus, it is only necessary to run the transmit filter at the time slot rate, and the output of the transmit filter when it is run, is placed onto the digital line.

The above techniques permit an improved transmit filter design and operation which has the same filter outputs but achieves operational and storage efficiencies. Indeed, one notable consequence of using such techniques to implement digital low pass finite impulse response filter 101 in the system of FIG. 1 is that M is no longer equal to N, but instead, N=M/P. Should it result that M/P is not an integer, then up to P-1 zero coefficients are added to the end of the filter so as to increase the value of M/P, and hence N, until an integer result is obtained. The zero coefficients are added to the end of the filter to avoid increasing the throughput delay.

In the opposite direction, receive data values are moved into the filter delay line of the receive filter at the time slot rate, e.g., 8 kHz, and the receive filter output is computed and taken out at the sample rate, e.g., three times the symbol rate. However, the data input to the receive filter delay line is always zero at all times that do not also correspond to the arrival of new received data at the time slot rate, because there are no new data values being received at such times. Thus, in the receiver, there are I-1 zero values in the full-length version of the filter between each real value. Consequently, as with the transmit filter, the data of the receive filter may be stored in a compact form which leaves out the zero data values. Likewise, the receive filter coefficients may be specified so that only every Ith coefficient is used during any calculation of the receive filter output because it is only these coefficients that will correspond to non-zero receive data values. A consequence of using such techniques to implement digital low pass finite impulse response filter 101 in the system of FIG. 1 is that M is no longer equal to N, but instead, N=M/I. Should it result that M/I is not an integer, then up to I-1 zero coefficients are added to the end of the filter so as to increase the value of M/I, and hence N, until an integer result is obtained. The zero coefficients are added to the end of the filter to avoid increasing the throughput delay.

Figure 2:
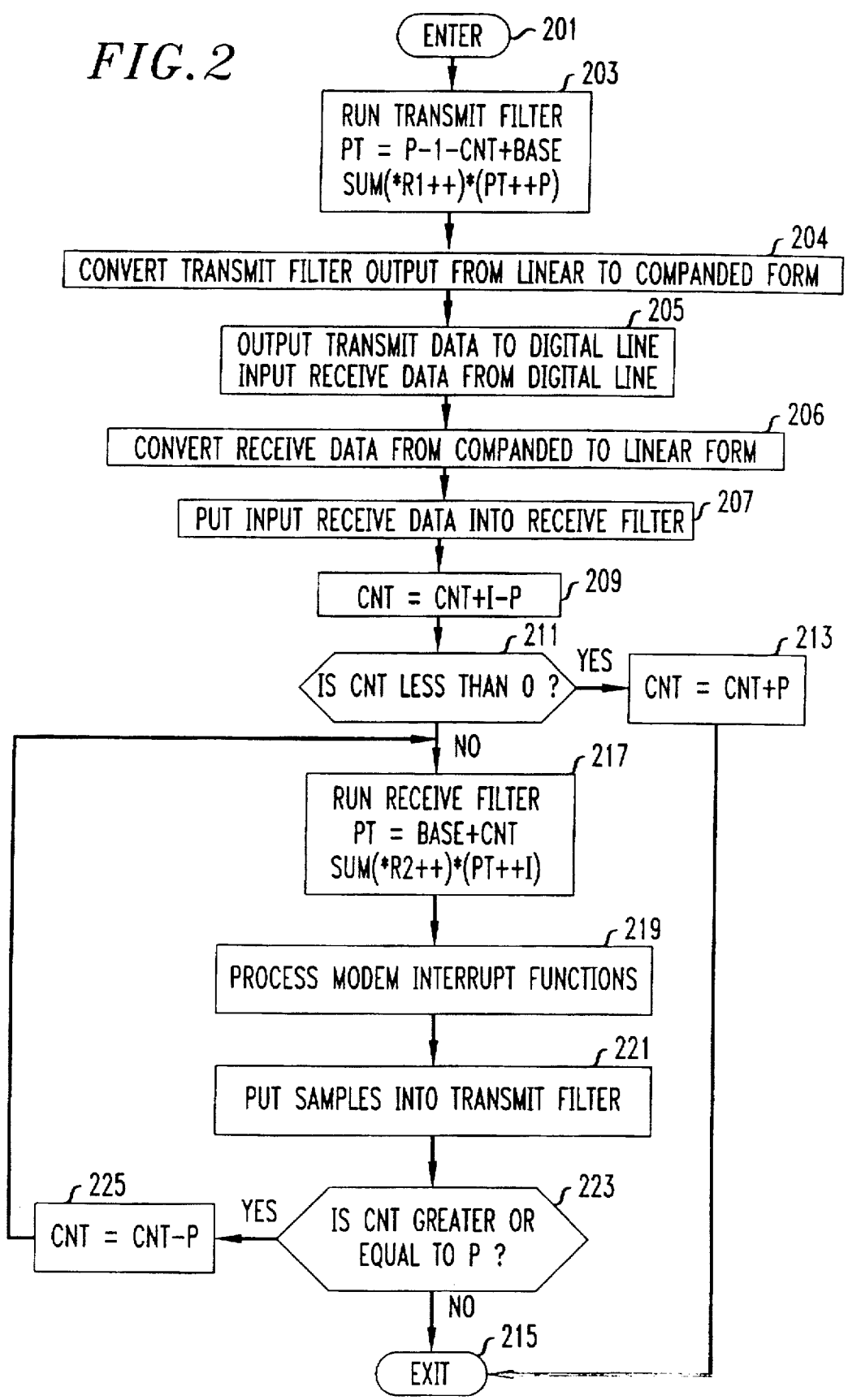
FIG. 2 shows a flow chart of an exemplary process for controlling the performance of interpolation and decimation using a modulo counter, in accordance with the principles of the invention.

FIG. 2 shows a flow chart of an exemplary process for controlling the performance of interpolation and decimation using a modulo counter, in accordance with the principles of the invention. The process is entered in step 201 when a time slot interrupt occurs, i.e., an interrupt that is generated when it is time to supply a sample to the digital line or to read a sample in from the digital line. A time slot interrupt occurs every 125 microseconds for a digital time slot rate of 8 kHz. In step 203, the transmit filter is run, i.e., the transmit filter is operated to produce a filter output value that is not necessarily zero. As indicated, the coefficient pointer, pt, which points to the first coefficient to be used for this operation of the transmit filter, is set to a value of P-1-cnt+base, where cnt is the modulo counter of the invention and base is the pointer to the location of the lowest coefficient. The filter values are computed by summing the product of the filter taps, the first of which is pointed to by R1, and every Pth filter coefficient starting with the one pointed to by pt, in accordance with an aspect of the invention. It is only necessary to compute the value for every Pth coefficient because, as noted above, the outputs of all the other taps of the transmit filter are zero.

Next in step 204, the transmit data, which is the value from the transmit filter, is encoded for transmission, e.g., companded using μ-law or A-law encoding. The encoded value is then supplied as an output to the digital line, while the receive data is input from the digital line in step 205. Thereafter, in step 206, the receive data that was input from the digital line is converted to linear form. For example, the receive data is converted from a companded form, such as μ-law or A-law representation, to a linear form, e.g., a 16 bit representation. In step 207, the linear receive data value is put into the receive filter. In accordance with an aspect of the invention, the value of cnt is increased by the difference between I and P in step 209.

Conditional branch point 211 tests to determine if the value of cnt is less than zero. If the test result in step 211 is YES, which only occurs when P>I, i.e., when the transmit sample rate is less than the digital time slot rate, control passes to step 213, in which the value of cnt is increased by the value of P, which makes cnt a modulo P counter, in accordance with an aspect of the invention. Control then passes to step 215, and the process is exited. This exiting effectuates a return from the time slot interrupt routine without executing the receive filter, i.e., skipping and not performing new calculations based on the new receive data sample which was present on the digital line and was placed into the receive filter. In accordance with an aspect of the invention, doing so maintains the proper ratio of the time slot rate to the receiver sample rate.

If the test result in step 211 is NO, control passes to step 217, in which the receive filter is run. The coefficient pointer, pt, which points to the first coefficient to be used for this operation of the receive filter, is set to a value of base+cnt, where cnt is the modulo counter of the invention and base is the pointer to the location of the lowest coefficient. The filter values are computed by summing the product of the filter taps, the first of which is pointed to by R2, and every Ith filter coefficient starting with the one pointed to by pt, in accordance with an aspect of the invention. As noted above, it is only necessary to compute the value for every Ith coefficient because all the outputs of all the other receive filter taps are zero. In step 219 the modem interrupt functions are processed. These functions are all the other processes relating to the modem's ability to transmit and receive data that the modem must perform each time a line interrupt occurs. Such processes may take some time to run, but must be completed on average within the time slot period (inverse of the time slot rate) of the digital line or the sample period (inverse of the sample rate), whichever is shorter. The next transmit sample generated by the modem at the modem transmit sample rate is put into the transmit filter in step 221.

Conditional branch point 223 tests to determine if cnt is greater than or equal to P, in accordance with the principles of the invention. If the test result is YES, indicating that the transmit sample rate is greater than the time slot rate, control passes to step 225, in which the value of cnt is decreased by P, making cnt a modulo P counter, in accordance with an aspect of the invention. Control then passes back to step 217 to process an additional sample in the receive filter as described above. If the test result in step 223 is NO, control passes to step 215 and the process is exited. Again, this exiting effectuates a return from the time slot interrupt routine.

Note that steps 201 through 211 are executed at the time slot rate while steps 217 through 223 are executed at the modem sample rate and the execution of both phases is controlled by the modulo counter cnt, in accordance with the principles of the invention.

Although the invention has been described above using the example of a digital low pass finite impulse response digital filter, this filter was chosen for convenience in the application in which the invention was developed. However, any other type of filter may be used. For example the filter may be instead a) an infinite impulse response filter or b) any other sampled data filter. Moreover, the filter need not be a low pass type filter but may be bandpass or high pass-type filter.

The principles of the invention allow for simple implementation of independent transmit and receive symbol rates in a single signal processor. To do so, as will be appreciated by those skilled in the art, separate I, P, and modulo counters are employed for the transmit and receive processes. For each time slot interrupt, the process of FIG. 2 is run twice, once for the transmitter and once for the receiver. When the process is run for the transmitter, only those operations of FIG. 2 that relate to the transmit function are executed and the I, P, and modulo counter of the transmitter are used where I, P, and cnt are called for in the process of FIG. 2. Likewise, when the process is run for the receiver, only those operations of FIG. 2 that relate to the receive function are executed and the I, P, and modulo counter of the receiver are used where I, P, and cnt are called for in the process of FIG. 2.

The foregoing merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. A method for use in a modem transmitter attached to a digital line, said digital line having a predetermined, fixed, time slot rate, for transmitting a signal represented by samples having a sample rate that is different from said time slot rate, the method comprising the steps of:

filtering said signal represented by samples at said sample rate using a digital filter; and supplying said filtered sampled information at said time slot rate;

wherein the ratio of said time slot rate of the digital line to said sample rate is determined as a ratio of smallest possible integers, and wherein said digital filter is operated in response to a modulo counter so that said digital filter has an effective sampling rate that is set to the numerator of said resulting ratio multiplied by the sample rate.

2. The invention as defined in claim 1 wherein the outputs of said digital filter are only computed at said time slot rate.

3. The invention as defined in claim 1 wherein said digital filter is not operated to produce output values when a time slot is not available on said digital line.

4. The invention as defined in claim 1 wherein said digital filter is a digital low pass finite impulse response filter.

5. The invention as defined in claim 1 wherein said digital filter has a set of predetermined coefficients and wherein only a subset of said coefficients are used each time said digital filter is operated, said subset being selected as a function of the value of said modulo counter.

6. The invention as defined in claim 1 wherein the modulus of said modulo counter is the numerator of said ratio of smallest possible integers.

7. The invention as defined in claim 6 wherein said digital filter has a set of predetermined coefficients and wherein only a subset of said coefficients are used each time said digital filter is operated, said subset being selected as a function of the value of said modulo counter and the modulus of said modulo counter.

8. The invention as defined in claim 1 wherein said modem transmitter shares coefficients of said digital filter with a receiver of said modem.

9. The invention as defined in claim 8 wherein said receiver employs only a subset of said coefficients each time a receiver digital filter is operated, said subset being selected as a function of the value of said modulo counter and the denominator of said ratio of smallest possible integers.

10. A method for use in a modem receiver attached to a digital line, said digital line having a predetermined, fixed, time slot rate, for developing a modem receive signal represented by samples having a sample rate that is different from said time slot rate, the method comprising the steps of:

filtering data values received from said digital line at said time slot rate using a digital filter; and supplying said filtered sampled information at said sample rate that is different from said time slot rate;

wherein the ratio of said time slot rate of the digital line to said sample rate is determined as a ratio of smallest possible integers, and wherein said digital filter is operated in response to a modulo counter so that said digital filter has an effective sampling rate that is set to the numerator of said resulting ratio multiplied by the sample rate.

11. The invention as defined in claim 10 wherein the output of said digital filter is only computed at said sample rate.

12. The invention as defined in claim 10 wherein said digital filter is not operated to produce output values when such values are necessarily zero regardless of the value of said sampled information.

13. The invention as defined in claim 10 wherein said digital filter is a low pass finite impulse response filter.

14. The invention as defined in claim 10 wherein said digital filter has a set of predetermined coefficients and wherein only a subset of said coefficients are used each time said digital filter is operated, said subset being selected as a function of the value of said modulo counter.

15. The invention as defined in claim 10 wherein the modulus of said counter is the numerator of said ratio of smallest possible integers.

16. The invention as defined in claim 15 wherein said digital filter has a set of predetermined coefficients and wherein only a subset of said coefficients are used each time said digital filter is operated, said subset being selected as a function of the value of said modulo counter and the denominator of said ratio of smallest possible integers.

17. The invention as defined in claim 10 wherein said modem receiver shares coefficients of said digital filter with a transmitter of said modem.

18. The invention as defined in claim 17 wherein said transmitter employs only a subset of said coefficients each time a transmitter digital filter is operated, said subset being selected as a function of the value of said modulo counter and the numerator of said ratio of smallest possible integers.

19. A method for use in digitally interpolating or decimating a first digital signal at a first sample rate to a second digital signal at a second sample rate, the method comprising the steps of:

filtering said first digital signal to produce a filtered version of said first digital signal; and taking particular values of said version of said first digital signal at said second sample rate to produce said second digital signal;

wherein said filtering and said taking are responsive to a modulo counter.

20. The invention as defined in 19 wherein said filtering is low pass filtering.

21. The invention as defined in 19 wherein said particular values are only computed at said first sample rate.

22. The invention as defined in 19 wherein said particular values are only computed at said second sample rate.

23. The invention as defined in 19 wherein the value of said modulo counter is updated at said first sample rate.

24. The invention as defined in 19 wherein the value of said modulo counter is updated at said second sample rate.

25. The invention as defined in 19 wherein said first sample rate is a modem sample rate and said second sample rate is a time slot rate of a digital line.

26. The invention as defined in 19 wherein said first sample rate is a time slot rate of a digital line and said second sample rate is a modem sample rate.

27. The invention as defined in 26 wherein the ratio of said time slot rate of the digital line to said modem sample rate is determined as a ratio of the smallest possible integers, and wherein said modulo counter has a modulus of the numerator of said ratio.

28. The invention as defined in claim 26 wherein said particular values are only computed at said time slot rate.

29. Apparatus for use in digitally interpolating or decimating a first digital signal at a first sample rate to a second digital signal at a second sample rate, the apparatus comprising:

a low pass finite impulse response digital filter for low pass filtering said first digital signal to produce a filtered version of said first digital signal; and a modulo counter;

wherein operation of said low pass finite impulse response digital filter is responsive to said modulo counter to produce said second digital signal at said second sample rate.

30. Apparatus for use in digitally interpolating or decimating a first digital signal at a first sample rate to a second digital signal at a second sample rate, said apparatus comprising:

means for filtering said first digital signal to produce a filtered version of said first digital signal;

means for supplying particular values of said version of said first digital signal at said second sample rate to produce said second digital signal; and a modulo counter;

wherein said means for filtering is responsive to said modulo counter.

31. Apparatus for use in digitally interpolating or decimating a first digital signal at a first sample rate to a second digital signal at a second sample rate, said apparatus comprising:

means for filtering said first digital signal to produce a filtered version of said first digital signal;

means for supplying particular values of said version of said first digital signal at said second sample rate to produce said second digital signal; and a modulo counter having a modulus that is set to a numerator of a ratio of said second sample rate to said first sample rate expressed in smallest possible integer form;

wherein said means for supplying is responsive to said modulo counter.

* * * * *

UNITED STATES PATENT AND TRADEMARK OFFICE
CERTIFICATE OF CORRECTION

PATENT NO. : 5,768,311
DATED : June 16, 1998
INVENTOR(S) : Betts et al

It is certified that error appears in the above-identified patent and that said Letters Patent is hereby corrected as shown below:

Column 1, line 45, after the phrase "depends on", delete --the--.
Column 3, line 6, after the phrase "In accordance with", delete --the--.
Column 3, line 48, after "running", at the end of the line, insert therefore --a--.
Column 4, line 50, please remove the bold face type from the number "2743".
Column 9, line 8, Claim 20, after "as defined in", insert --claim--.
Column 9, line 11, Claim 21, after "as defined in", insert --claim--.
Column 9, line 13, Claim 22, after "as defined in", insert --claim--.
Column 9, line 15, Claim 23, after "as defined in", insert --claim--.
Column 9, line 17, Claim 24, after "as defined in", insert --claim--.
Column 9, line 19, Claim 25, after "as defined in", insert --claim--.
Column 9, line 22, Claim 26, after "as defined in", insert --claim--.

Signed and Sealed this

Eighth Day of December, 1998

Attest:

BRUCE LEHMAN

*Attesting Officer*    *Commissioner of Patents and Trademarks*